United States Patent
Quinones et al.

(10) Patent No.: US 7,824,966 B2
(45) Date of Patent: Nov. 2, 2010

(54) FLEX CHIP CONNECTOR FOR SEMICONDUCTOR DEVICE

(75) Inventors: Maria Clemens Y. Quinones, Cebu (PH); Jocel P. Gomez, Cebu (PH)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 12/544,159

(22) Filed: Aug. 19, 2009

(65) Prior Publication Data

US 2009/0311832 A1    Dec. 17, 2009

Related U.S. Application Data

(62) Division of application No. 11/972,418, filed on Jan. 10, 2008, now Pat. No. 7,626,249.

(51) Int. Cl.
H01L 21/60    (2006.01)

(52) U.S. Cl. .................. 438/123; 257/E21.502

(58) Field of Classification Search ............. 438/123; 257/666–669, E21.502
See application file for complete search history.

(56) References Cited

U.S. PATENT DOCUMENTS

| | | |
|---|---|---|
| 3,956,821 A | 5/1976 | Martin |
| 4,058,899 A | 11/1977 | Phy |
| 4,191,943 A | 3/1980 | Cairns et al. |
| 4,680,613 A | 7/1987 | Daniels et al. |
| 4,720,396 A | 1/1988 | Wood |
| 4,731,701 A | 3/1988 | Kuo et al. |
| 4,751,199 A | 6/1988 | Phy |
| 4,772,935 A | 9/1988 | Lawler et al. |
| 4,791,493 A | 12/1988 | Ogura et al. |
| 4,796,080 A | 1/1989 | Phy |
| 4,839,717 A | 6/1989 | Phy et al. |
| 4,890,153 A | 12/1989 | Wu |
| 5,327,325 A | 7/1994 | Nicewarner, Jr. |
| 5,646,446 A | 7/1997 | Nicewarner, Jr. et al. |
| 5,776,797 A | 7/1998 | Nicewarner, Jr. et al. |
| 6,133,634 A | 10/2000 | Joshi |
| 6,329,706 B1 | 12/2001 | Nam |
| 6,424,035 B1 | 7/2002 | Sapp et al. |
| 6,432,750 B2 | 8/2002 | Jeon et al. |
| 6,449,174 B1 | 9/2002 | Elbanhawy |
| 6,465,276 B2 | 10/2002 | Kuo |
| 6,489,678 B1 | 12/2002 | Joshi |
| 6,556,750 B2 | 4/2003 | Constantino et al. |
| 6,566,750 B1 | 5/2003 | Sofue et al. |
| 6,574,107 B2 | 6/2003 | Jeon et al. |
| 6,621,152 B2 | 9/2003 | Choi et al. |
| 6,627,991 B1 | 9/2003 | Joshi |
| 6,630,726 B1 | 10/2003 | Crowley et al. |

(Continued)

*Primary Examiner*—Nathan Ha
(74) *Attorney, Agent, or Firm*—Townsend and Townsend and Crew LLP

(57) ABSTRACT

A semiconductor die package. The semiconductor die package includes a semiconductor die having a first surface comprising a die contact region, and a second surface. It also includes a leadframe structure having a die attach pad and a lead structure, where the semiconductor die is attached to the die attach pad. It also includes a flex clip connector comprising a flexible insulator, a first electrical contact region, and a second electrical contact region. The first electrical contact region of the flex clip connector is coupled to the die contact region and the second electrical contact region of the flex clip connector is coupled to the lead structure.

20 Claims, 8 Drawing Sheets

U.S. PATENT DOCUMENTS

| | | | |
|---|---|---|---|
| 6,645,791 | B2 | 11/2003 | Noquil et al. |
| 6,674,157 | B2 | 1/2004 | Lang |
| 6,683,375 | B2 | 1/2004 | Joshi et al. |
| 6,696,321 | B2 | 2/2004 | Joshi |
| 6,720,642 | B1 | 4/2004 | Joshi et al. |
| 6,731,003 | B2 | 5/2004 | Joshi et al. |
| 6,740,541 | B2 | 5/2004 | Rajeev |
| 6,756,689 | B2 | 6/2004 | Nam et al. |
| 6,774,465 | B2 | 8/2004 | Lee et al. |
| 6,777,800 | B2 | 8/2004 | Madrid et al. |
| 6,806,580 | B2 | 10/2004 | Joshi et al. |
| 6,830,959 | B2 | 12/2004 | Estcio |
| 6,836,023 | B2 | 12/2004 | Joshi et al. |
| 6,867,481 | B2 | 3/2005 | Joshi et al. |
| 6,867,489 | B1 | 3/2005 | Estacio |
| 6,891,256 | B2 | 5/2005 | Joshi et al. |
| 6,891,257 | B2 | 5/2005 | Chong et al. |
| 6,893,901 | B2 | 5/2005 | Madrid |
| 6,943,434 | B2 | 9/2005 | Tangpuz et al. |
| 6,989,588 | B2 | 1/2006 | Quinones et al. |
| 6,992,384 | B2 | 1/2006 | Joshi |
| 7,022,548 | B2 | 4/2006 | Joshi et al. |
| 7,023,077 | B2 | 4/2006 | Madrid |
| 7,061,077 | B2 | 6/2006 | Joshi |
| 7,061,080 | B2 | 6/2006 | Jeun et al. |
| 7,081,666 | B2 | 7/2006 | Joshi et al. |
| 7,122,884 | B2 | 10/2006 | Cabahug et al. |
| 7,154,168 | B2 | 12/2006 | Joshi et al. |
| 7,157,799 | B2 | 1/2007 | Noquil et al. |
| 7,196,313 | B2 | 3/2007 | Quinones et al. |
| 7,199,461 | B2 | 4/2007 | Son et al. |
| 7,208,819 | B2 | 4/2007 | Jeun et al. |
| 7,215,011 | B2 | 5/2007 | Joshi et al. |
| 7,217,594 | B2 | 5/2007 | Manatad |
| 7,242,076 | B2 | 7/2007 | Dolan |
| 7,256,479 | B2 | 8/2007 | Noquil et al. |
| 7,268,414 | B2 | 9/2007 | Choi et al. |
| 7,271,497 | B2 | 9/2007 | Joshi et al. |
| 7,285,849 | B2 | 10/2007 | Cruz et al. |
| 7,315,077 | B2 | 1/2008 | Choi et al. |
| 7,332,806 | B2 | 2/2008 | Joshi et al. |
| 7,408,251 | B2 * | 8/2008 | Hata et al. .................. 257/678 |
| 7,626,249 | B2 | 12/2009 | Quinones et al. |
| 2006/0214222 | A1 | 9/2006 | Challa et al. |
| 2008/0048342 | A1 | 2/2008 | Cheah et al. |
| 2008/0224300 | A1 | 9/2008 | Otremba |

* cited by examiner

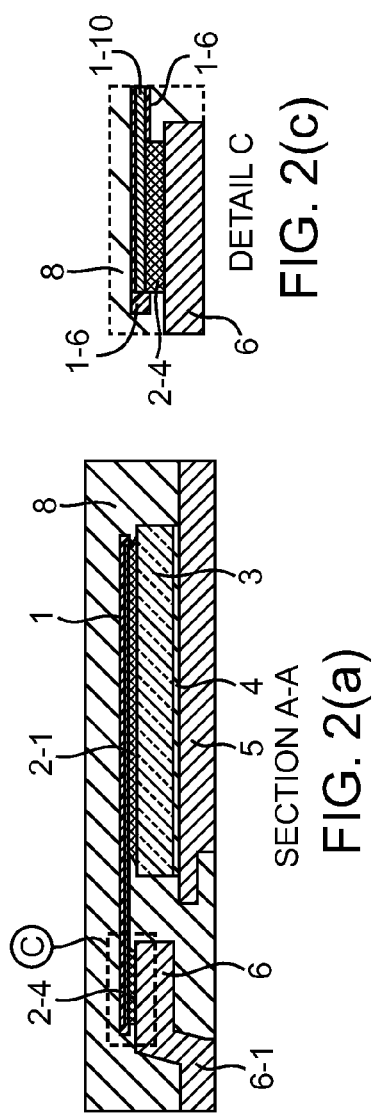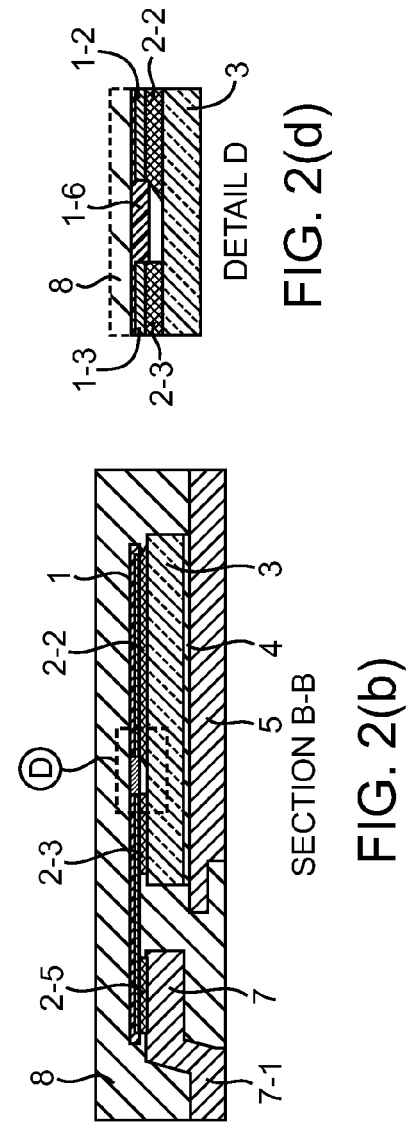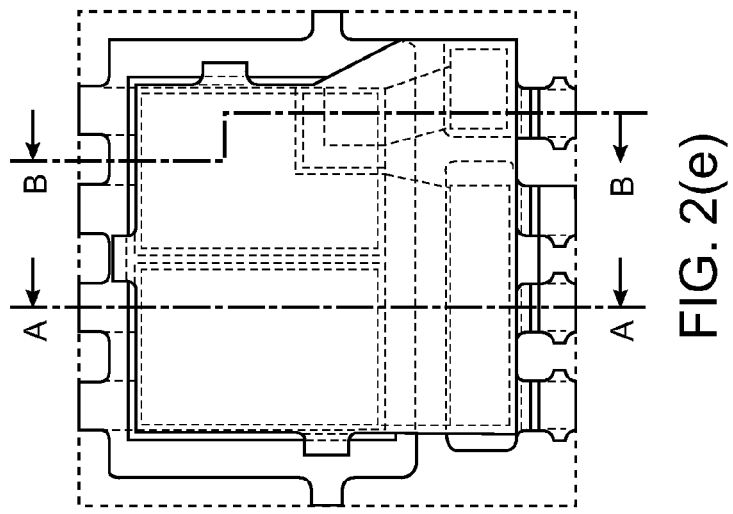

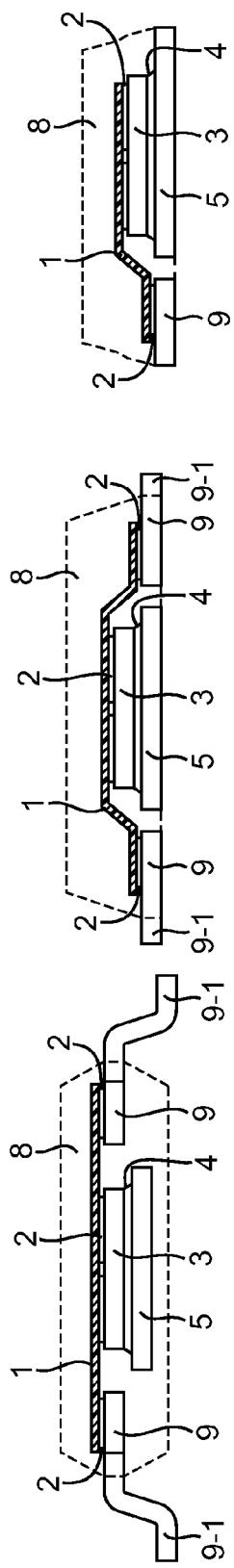

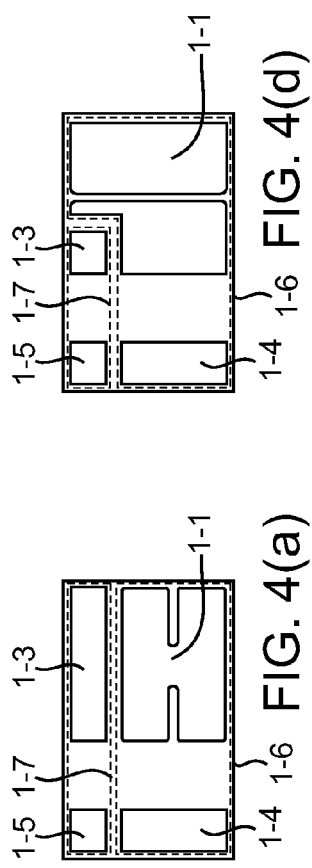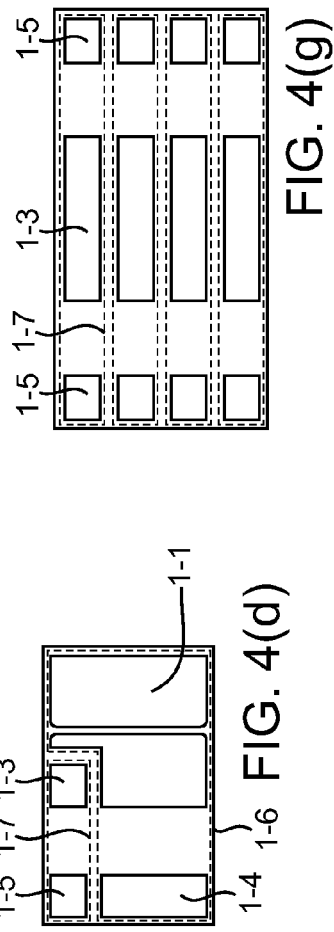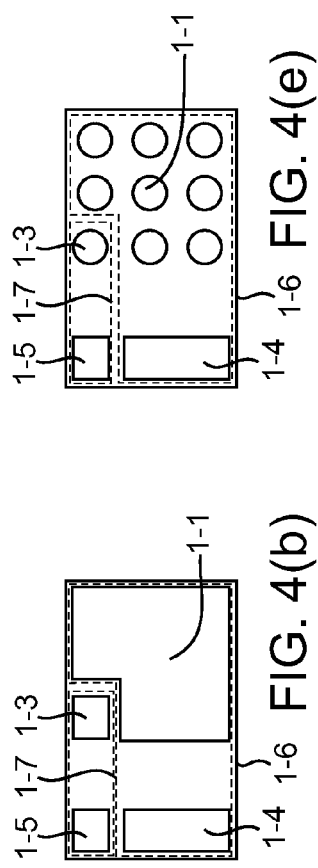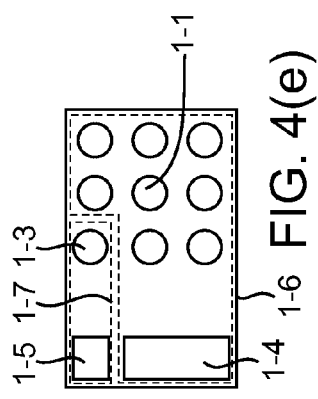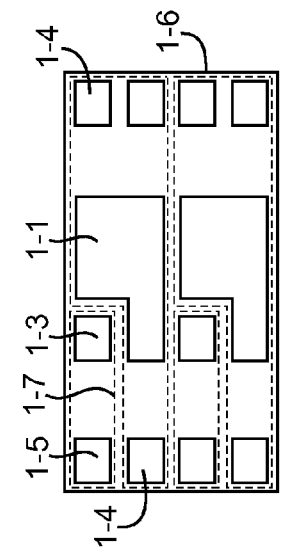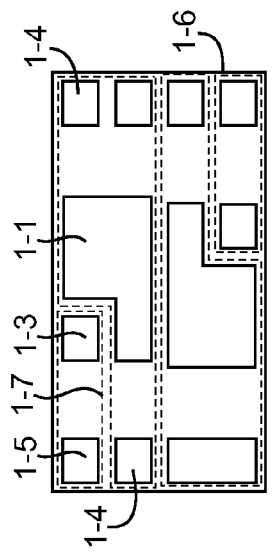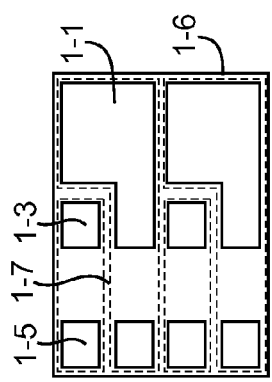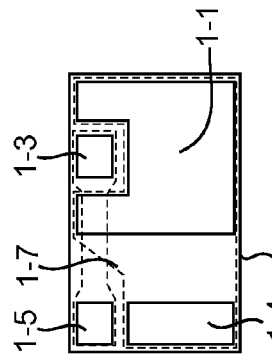

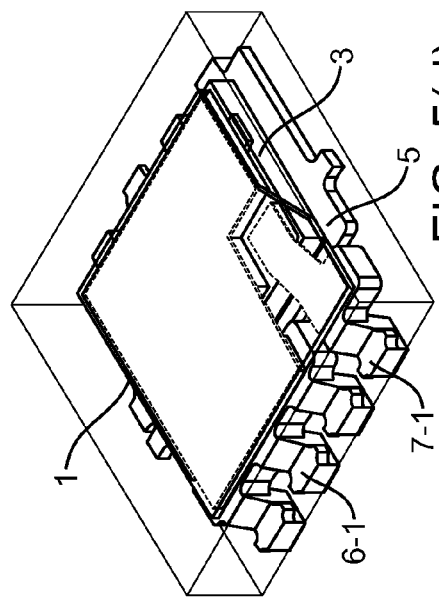
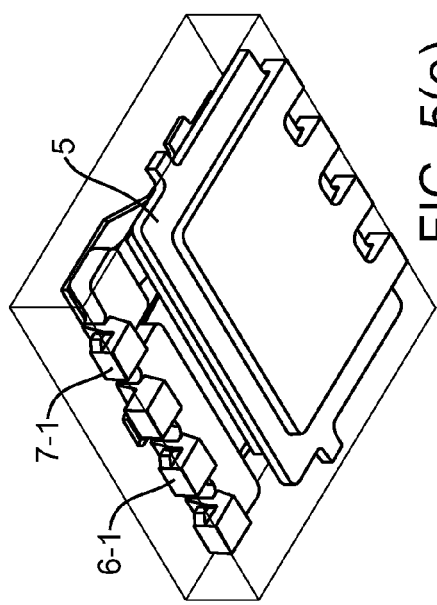
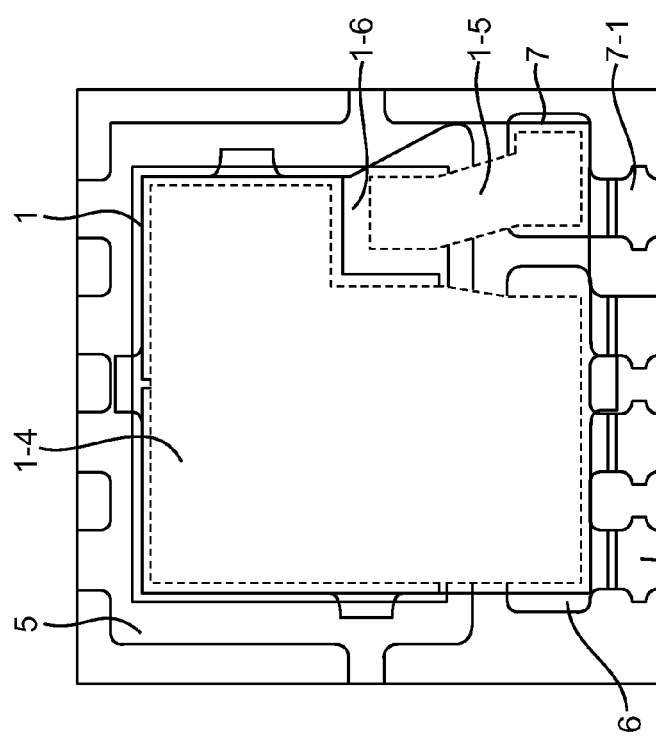
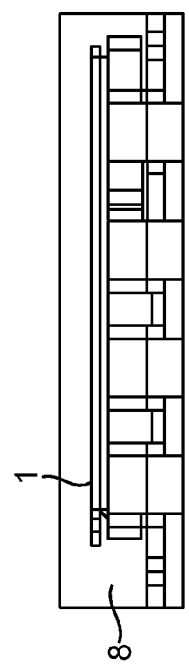
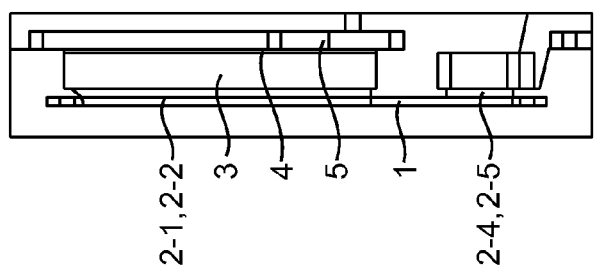

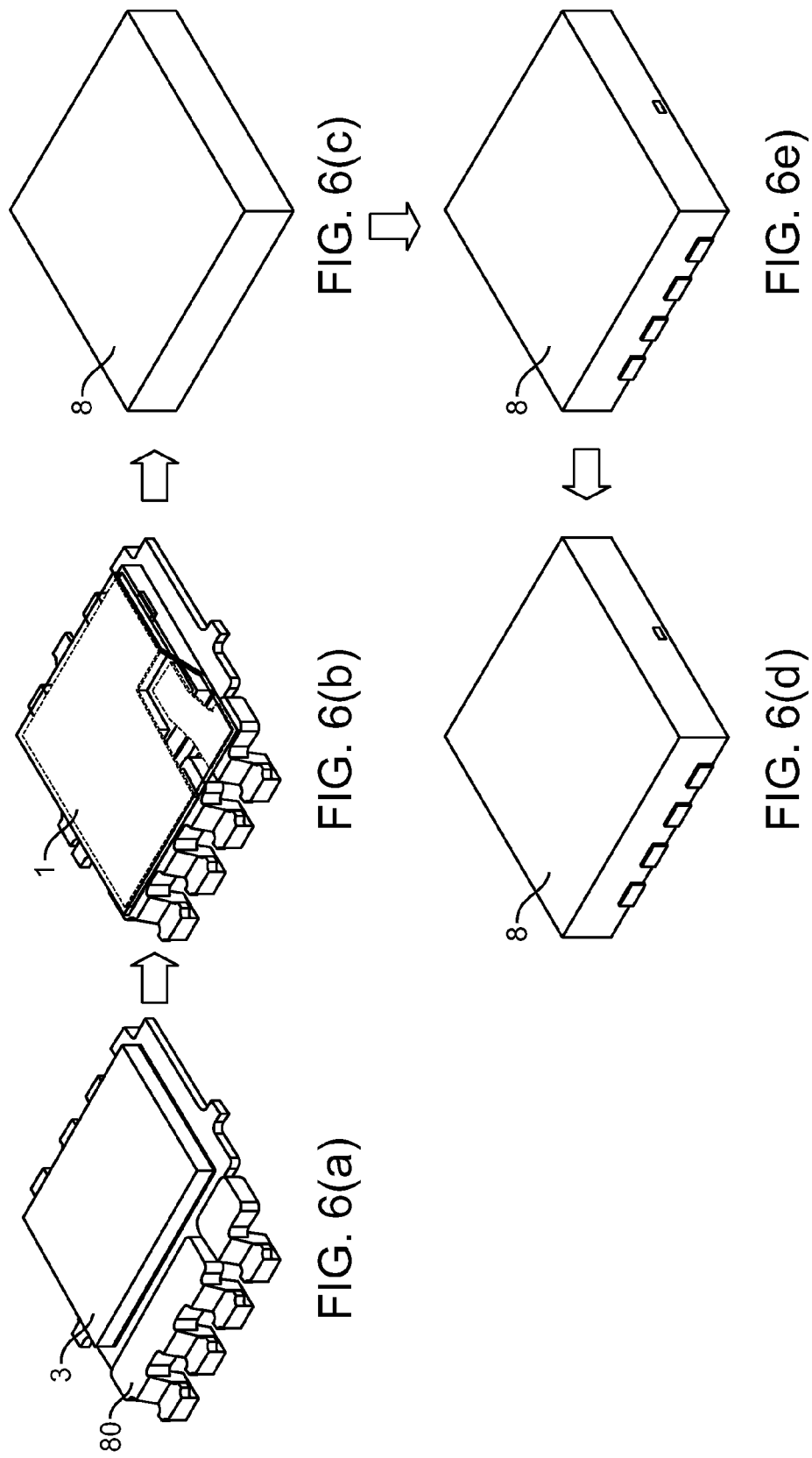

FLEX CHIP CONNECTOR FOR SEMICONDUCTOR DEVICE

CROSS-REFERENCES TO RELATED APPLICATIONS

This application is a divisional patent application of U.S. patent application Ser. No. 11/972,418, filed Jan. 10, 2008, which is incorporated by reference in its entirety for all purposes.

BACKGROUND

Semiconductor die packages using conductive clip structures are known. For example, a semiconductor die package using a rigid clip structure is described in U.S. Pat. No. 6,465,276. The clip structure described in U.S. Pat. No. 6,465,276 connects a source region and a gate region at one surface of a semiconductor die to corresponding leads. In this patent, source and gate contacts of the clip are initially connected by a tie bar. Separation of the gate and source connection of the clip is performed by laser cutting of the connecting tie bar, after clip is bonded to the die. Also, the clip structure is only applicable to a single die configuration.

Since the clip structure is rigid, the horizontal alignment of any two structures to be connected by the clip structure needs to be relatively precise. If two structures are not horizontally aligned, the clip structure may not contact one of the structures and rework may be needed. Also, the additional laser cutting step can increase processing time during the package assembly process.

Embodiments of the invention address these, and other problems, individually and collectively.

BRIEF SUMMARY

Embodiments of the invention include semiconductor die packages and method for making the same.

One embodiment of the invention is directed to a semiconductor die package comprising a semiconductor die having a first surface comprising a die contact region, and a second surface. It also has a leadframe structure having a die attach pad and a lead structure, where the semiconductor die is attached to the die attach pad. It further includes a flex clip connector comprising a flexible insulator, a first electrical contact region, and a second electrical contact region, where the first electrical contact region of the flex clip connector is coupled to the die contact region and wherein the second electrical contact region of the flex clip connector is coupled to the lead structure. The first and second electrical contact regions can form part of a conductive trace or can be connected to a conductive trace.

Another embodiment of the invention is directed to a method for forming a semiconductor die package. The method includes attaching a semiconductor die having a first surface comprising a die contact region, and a second surface, to a leadframe structure comprising a die attach pad and a lead structure. The semiconductor die is attached to the die attach pad. The method also includes attaching a flex clip connector to the semiconductor die and the leadframe structure, where the flex clip connector comprises a flexible insulator, a first electrical contact region, and a second electrical contact region. The first electrical contact region of the flex clip connector is coupled to the die contact region and the second electrical contact region of the flex clip connector is coupled to the lead structure.

These and other embodiments of the invention are described in further detail below.

BRIEF DESCRIPTION OF THE DRAWINGS

FIGS. 2(a) and 2(b) show cross-sectional side views of the semiconductor die package shown in FIG. 2(e) along the lines A-A and B-B, respectively.

FIGS. 2(c) and 2(d) show detailed regions C and D in FIGS. 2(a) and 2(b) respectively.

FIG. 2(e) shows a top plan view of the package shown in FIG. 1.

FIGS. 3(a)-3(f) show side views of various semiconductor die package configurations including flex clip connectors.

FIG. 5(a) shows a side view of another semiconductor die package according to an embodiment of the invention.

FIG. 5(b) shows a top view of the package illustrated in FIG. 5(a).

FIG. 5(c) shows another side view of the package illustrated in FIG. 5(a).

FIG. 5(d) is a top perspective view of the package illustrated in FIG. 5(a).

FIG. 5(e) is a bottom perspective view of the package illustrated in FIG. 5(c).

FIGS. 6(a)-6(e) illustrate precursors that are formed in the formation of a semiconductor die package according to an embodiment of the invention.

DETAILED DESCRIPTION

Embodiments of the invention are directed to packages and methods incorporating a flex clip connector. The flex clip connector may have conductive traces of any suitable thickness, and a flexible supporting insulator that supports the conductive traces. Ends of the conductive traces may incorporate contact regions that will contact regions of one or more semiconductor dies as well as regions of a leadframe structure. The insulator may be comprised of one or more dielectric layers. In some embodiments, the insulator comprises a plastic material such as polyimide or polyamide. The flex clip connectors can be used in semiconductor die packages that have one, two, or any suitable number of semiconductor dies. Since the flex clip connectors according to embodiments of the invention can be already formed prior to assembling the other components of a semiconductor die package, fewer steps are needed in a final semiconductor die package assembly process.

The flex clip connectors according to embodiments of the invention can replace or can be used in conjunction with conventional rigid copper clips for bonding applications, for example, in low RDSon power packages. An exemplary flex clip connector can be attached to a die bonded leadframe or substrate as one piece, even if the semiconductor die package to be formed has multiple semiconductor dice. The flex clip connector can be attached to a semiconductor die bonded leadframe structure in a block or group of flex clip connectors, so that throughput is higher as compared to singulated copper clip attach methods. The flex clip connectors according to embodiments of the invention are also lightweight, and intricate copper trace designs can be used to accommodate various package designs. Embodiments of the invention also provide a maximized electrical connection of a DMOS (diffused metal oxide semiconductor) die source pad to a leadframe structure for reduced device on-resistance through conductive trace (e.g., copper trace) conduction. The flex clip connectors can also be designed for top-set or down-set package configurations where the top surface of a semiconductor die does not form a perfectly flat plane with a bonding surface of a corresponding lead structure bonding post.

Figure 1:
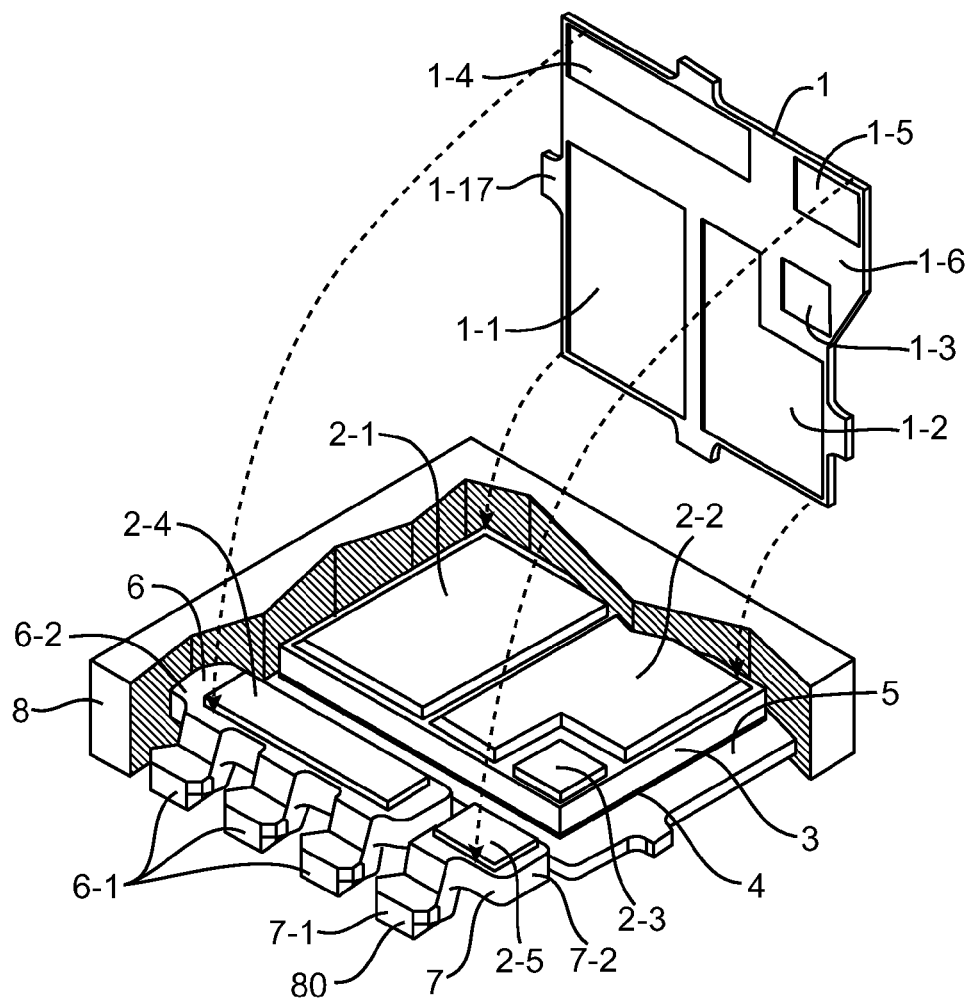
FIG. 1 shows a perspective view of a semiconductor die package according to an embodiment of the invention. A portion of the molding material is cut away and the flex clip connector is lifted to show its underside.

FIG. 1 shows a semiconductor die package according to one embodiment of the invention. The semiconductor die package includes a semiconductor die 3 having a first surface comprising at least one die contact region. In this example, the at least one die contact region comprises source contact regions covered with conductive adhesives 2-1, 2-2, and a gate contact region covered with another conductive adhesive 2-3. A second surface of the semiconductor die 3, that is opposite the first surface of the semiconductor die 3, may be attached to a die attach pad 5 (or drain pad in this example) of a leadframe structure 80. The semiconductor die 3 may be attached to the die attach pad 5 using a conductive adhesive 4 such as solder. The die attach pad 5 serves as a drain connection (i.e., an output connection) for a MOSFET (metal oxide semiconductor field effect transistor) device in the semiconductor die 3.

Figure 7:
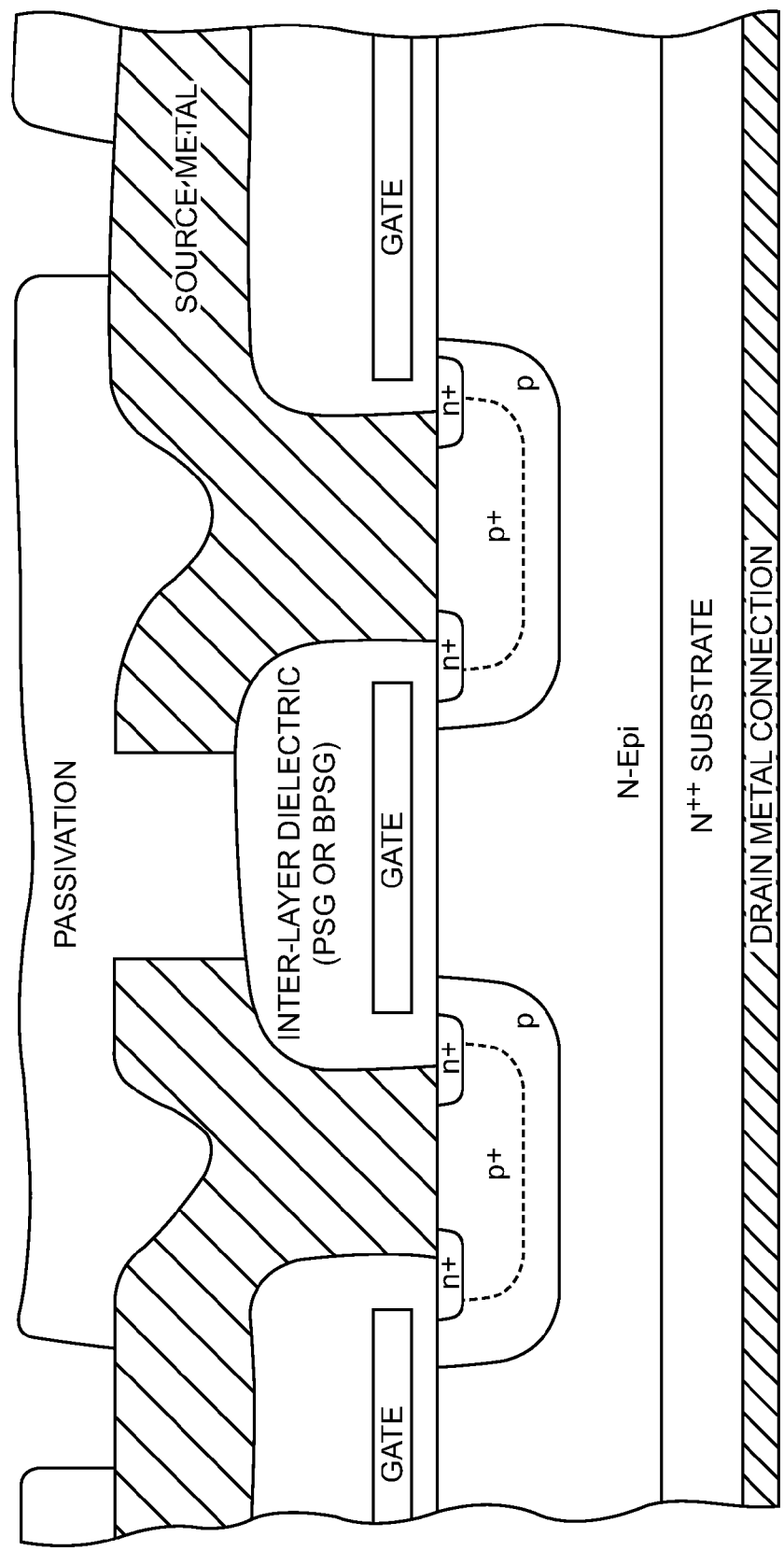
FIG. 7 shows a schematic cross-section of a vertical power MOSFET.

The semiconductor dies used in the semiconductor die packages according to preferred embodiments of the invention include vertical power transistors. Exemplary vertical power transistors are described, for example, in U.S. Pat. Nos. 6,274,905, and 6,351,018, both of which are assigned to the same assignee as the present application, and both which are herein incorporated by reference in their entirety for all purposes. Vertical power transistors include VDMOS (vertical diffused metal oxide semiconductor) transistors. A VDMOS transistor is a MOSFET that has two or more semiconductor regions formed by diffusion. It has a source region, a drain region, and a gate. The device is vertical in that the source region and the drain region are at opposite surfaces of the semiconductor die. The gate may be a trenched gate structure or a planar gate structure, and is formed at the same surface as the source region. Trenched gate structures are preferred, since trenched gate structures are narrower and occupy less space than planar gate structures. During operation, the current flow from the source region to the drain region in a VDMOS device is substantially perpendicular to the die surfaces. An example of a vertical MOSFET is shown in FIG. 7.

Referring again to FIG. 1, in addition to the die attach pad 5, the leadframe structure 80 also includes a source lead structure 6 with a plurality of source leads 6-1 extending from a perpendicularly oriented source post 6-2. The leadframe structure 80 also includes a gate structure 7 with a gate lead 7-1 also extending from a gate post 7-2. The gate structure 7 and the source structure 6 are separated from each other and from the die attach pad 5.

As used herein, the term "leadframe structure" can refer to a structure that is derived from a lead frame. A typical leadframe structure includes a source lead structure, a gate lead structure, and an optional dummy lead structure. A leadframe structure may include continuous or discontinuous sections of metal. Suitable leadframe structures may be obtained using any suitable process including etching, stamping etc. They may also include a base metal such as copper or aluminum, and may or may not be plated with another material (such as Ni/Pd).

The semiconductor die package in FIG. 1 also includes a flex clip connector 1, which comprises a side tab 1-17. It also comprises a flexible insulator 1-6, die source contact regions 1-1, 1-2, and a lead post source contact region 1-4. The contact regions 1-1, 1-2, and 1-4 may be part of a single conductive trace sandwiched between a first flexible insulating top layer and a discontinuous flexible bottom layer which defines the contact regions 1-1, 1-2, and 1-4. The lead post source contact region 1-4 is electrically and mechanically coupled to the source lead structure 6 using a conductive adhesive 2-4 (e.g., solder or a conductive epoxy), and the die source contact regions 1-1, 1-2 are coupled to source conductive adhesives 2-1, 2-2 on source die contact regions in the die 3. Source current can flow from the source lead structure 6 to the source conductive adhesives 2-1, 2-2 on the die source contact regions via a conductive path that is formed between the lead post source contact region 1-4 and the die source contact regions 1-1, 1-2. The conductive path may comprise a metallic layer that is sandwiched between dielectric layers in the insulator 1-6.

The lead post gate contact region 1-5 in the flex clip connector 1 is coupled to the gate lead structure 7 via a conductive adhesive 2-5. A die gate contact region 1-3 in the flex clip connector 1 is coupled to a gate conductive adhesive 2-3 on a gate die contact region in the die 3. Gate current can flow from the gate lead structure 7 to the gate conductive adhesive 2-3 on the gate region in the semiconductor die 3 via a conductive path that is formed between the lead post gate contact region 1-5 and the gate die contact region 1-3. The conductive path may comprise a metallic layer that is sandwiched between dielectric layers in the insulator 1-6. The lead post gate contact region 1-5 and the gate die contact region 1-3, are electrically isolated from the source contact regions 1-1, 1-2, and 1-4.

A molding material 8 is formed around at least a portion of the leadframe structure 80, and the semiconductor die 3. The molding material 8 may cover the flex clip connector. The molding material 8 protects internal components of the semiconductor die package and may comprise any suitable material including an epoxy material.

FIGS. 2(*a*) and 2(*c*) illustrate side views of the semiconductor die package shown in FIG. 2(*e*) along the line A-A. As shown in FIG. 2(*a*), the die attach pad 5 is partially etched (e.g., half-etched) so that it is easier to lock the molding material 8 to the die attach pad 5. FIGS. 2(*a*) and 2(*c*) additionally show a conductive adhesive 2-4 attached to a source lead structure 6. The close up view in FIG. 2(*c*) shows a lead post source contact region extending from a conductive trace 1-10 which is partially sandwiched between two dielectric layers forming the insulator 1-6. As shown, the top dielectric layer of the insulator 1-6 is continuous, but the bottom dielectric layer of the insulator is discontinuous.

FIGS. 2(*b*) and 2(*d*) illustrate side views of the of the semiconductor die package shown in FIG. 2(*e*) along the line B-B. The close up view in FIG. 2(*d*) shows die gate and source contact regions 1-3, 1-2, attached to gate and source regions in the semiconductor die 3 using conductive adhesives 2-3, 2-2.

FIGS. 3(*a*)-3(*f*) show side views of various package embodiments that can use a flex clip connector. FIG. 3(*a*) shows a package with a flat design so that the flex clip connector 1 is flat when it is in the semiconductor die package. FIG. 3(*b*) shows a dual top-set design. As shown, the die 3 is set lower than corresponding leads 9. The leads 9 also have include external portions 9-1 which extend outside of the molding material 8. FIG. 3(*c*) shows a dual down-set design where the leads 9 are below the upper surface of the die 3. FIG. 3(*d*) shows a top-set design for TO type packages. As shown, a lead 9 is on one side of the die 3 and is above the upper surface of the die 3. Another lead is below the upper surface of the die 3 and extends from the die attach pad 5. FIG. 3(e) shows a down-set design where a lead 9 is on one side of the semiconductor die 3 and is down-set with respect to the upper surface of the die 3. FIG. 3(f) shows a down-set design with a flat terminal. As illustrated by FIGS. 3(a)-3(f), the flex clip connector 1 according to embodiments of the invention can be advantageously used in a number of different package configurations (e.g., top-set or down-set designs).

Figure 4J:
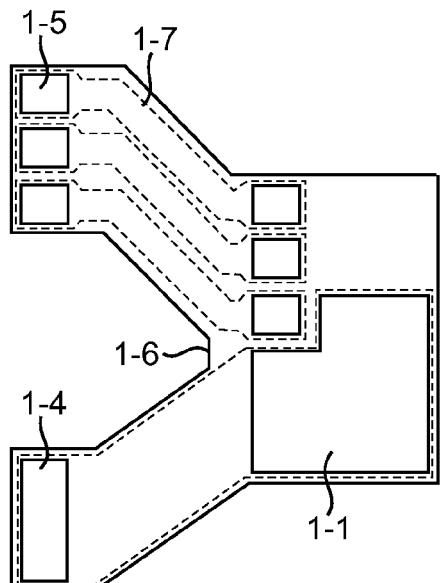
FIGS. 4(a)-4(k) show plan views of various flex clip connectors.
Figure 4K:
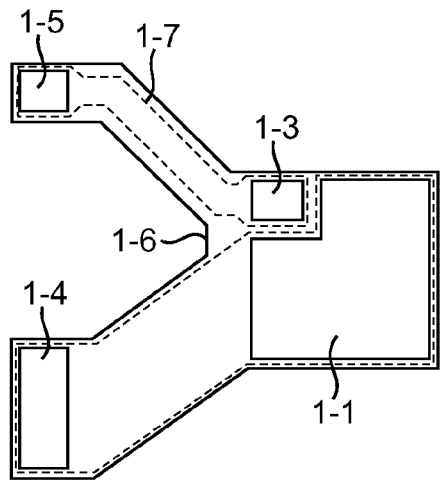
Figure 4L:
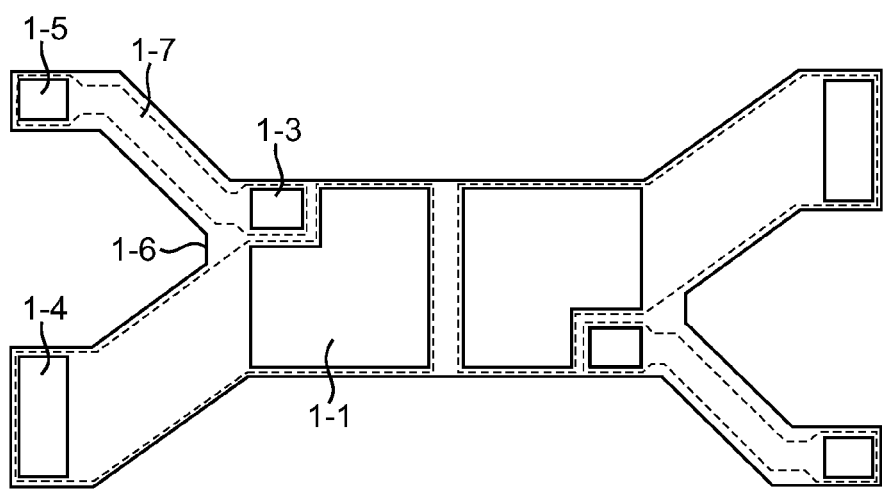

FIGS. 4(a)-4(I) show plan views of various flex clip connectors. In FIGS. 4(a)-4(i), reference number 1-7 refers to a flexible conductive (e.g., copper) trace. The other reference numbers are in these Figures are described above. FIGS. 4(a)-4(i) illustrate that the various contact regions can have any suitable defined shapes, and that the traces that interconnect such contact regions can also have different shapes. FIGS. 4(i)-4(I) illustrate different flex clip connectors with different shapes. Suitable flex clip connectors need not be limited to the rectangular shapes shown in FIGS. 4(a)-4(i), but can have different planar shapes to accommodate different package configurations.

FIG. 5(a) shows a side view of a package according to an embodiment of the invention. FIG. 5(b) shows a top view of the package illustrated in FIG. 5(a). FIG. 5(c) shows another side view of the package illustrated in FIG. 5(a). FIG. 5(d) is a top perspective view of the package illustrated in FIG. 5(a). FIG. 5(e) is a bottom perspective view of the package illustrated in FIG. 5(c). As shown in FIGS. 5(a)-5(e), the flex clip connector 1 may be covered with the molding material. However, the bottom surface of the die attach pad 5 may be exposed through the molding material 8 and an exterior surface of the molding material 8 may be substantially coplanar with the exposed surface of the die attach pad 5. The other components of the package shown in FIGS. 5(a)-5(e) are described above.

Also as shown in FIGS. 5(a)-5(e), the leads 6-1, 7-1 do not extend past the lateral surface of the molding material 8. The semiconductor die package illustrated in FIG. 1 may therefore be characterized as a "leadless" package. A "leaded" package can be one in which the leads of the package extend past the lateral edges of the molding material 8 of the semiconductor die package 100. Embodiments of the invention can include both leaded and leadless packages.

FIGS. 6(a)-6(e) illustrate precursors that are formed in the formation of a semiconductor die package according to an embodiment of the invention. A method for forming a package can be described with reference to FIGS. 6(a)-6(c).

The method includes attaching a semiconductor die 3 having a first surface comprising a die contact region, and a second surface to a leadframe structure 80 comprising a die attach pad and a lead structure.

Before or after the semiconductor die 3 is attached to the leadframe structure 80, the flex clip connector 1 is obtained. The flex clip connector 1 may be obtained (e.g., formed) using any suitable method. In one embodiment, a flexible sheet of dielectric material may be coated with a metal layer using deposition processes known in the art. Suitable metal deposition processes include electroplating, sputtering, blade coating, curtain coating et al. The conductive layer in the flex clip connector 1 may be formed using any suitable material including copper, aluminum, conductive pastes with conductive particles, etc.

After coating a first dielectric layer with a metallic material, an optional second dielectric layer may be patterned on the deposited metal (or conductive) layer. Dielectric patterning methods are well known in the art. Patterning can define exposed metal regions which may form the previously described contact regions.

The first and second dielectric layers may be formed using any suitable dielectric material. Suitable dielectric materials include polyimide, polyamide, etc.

After the flex clip connector 1 is obtained, the flex clip connector 1 is attached to the semiconductor die and the leadframe structure 80. As noted above, the flex clip connector 1 comprises a flexible insulator, a first electrical contact region, and a second electrical contact region. The first electrical contact region of the flex clip connector 1 is coupled to the die contact region and wherein the second electrical contact region of the flex clip connector 1 is coupled to the lead structure.

Conductive adhesives may be coated on the die 3, the leadframe structure 80, and/or the contact regions of the flex clip connector 1. After coating one of more of these components with conductive adhesives, they components can be aligned and bonded together as described above.

After bonding the flex clip connector 1 to the die 3 and the leadframe structure 80, a molding material 8 is formed around at least a portion of the flex clip connector 1, the semiconductor die 3, and a part of the leadframe structure 80. A molding tool with molding dies can be used to mold the molding material 8. Suitable molding process conditions are known to those of ordinary skill in the art.

After molding, a sawing/singulation process can be performed (FIG. 6(e)) and then test, and tape & reel processing can be performed (FIG. 6(e)).

As used herein "top" and "bottom" surfaces are used in the context of relativity with respect to a circuit board upon which the semiconductor die packages according to embodiments of the invention are mounted. Such positional terms may or may not refer to absolute positions of such packages.

The semiconductor die packages described above can be used in electrical assemblies including circuit boards with the packages mounted thereon. They may also be used in systems such as phones, computers, etc.

Any recitation of "a", "an", and "the" is intended to mean one or more unless specifically indicated to the contrary.

The terms and expressions which have been employed herein are used as terms of description and not of limitation, and there is no intention in the use of such terms and expressions of excluding equivalents of the features shown and described, it being recognized that various modifications are possible within the scope of the invention claimed.

Moreover, one or more features of one or more embodiments of the invention may be combined with one or more features of other embodiments of the invention without departing from the scope of the invention.

What is claimed is:

1. Method for forming a semiconductor die package comprising:

attaching a semiconductor die having a first surface comprising a die contact region, and a second surface to a leadframe structure comprising a die attach pad and a lead structure, wherein the semiconductor die is attached to the die attach pad; and attaching a flex clip connector to the semiconductor die and the leadframe structure, wherein the flex clip connector comprises a flexible insulator, a first electrical contact region, and a second electrical contact region, and wherein the first electrical contact region of the flex clip connector is coupled to the die contact region and wherein the second electrical contact region of the flex clip connector is coupled to the lead structure.

2. The method of claim 1 wherein the lead structure is a source lead structure and the die contact region is a source die contact region.

3. The method of claim 1 wherein the semiconductor die comprises a MOSFET.

4. The method of claim 1 wherein the lead structure is a first lead structure and wherein the leadframe structure comprises a second lead structure, wherein the first lead structure and the second lead structure are separated from the die attach pad.

5. The method of claim 1 wherein the first lead structure is a source lead structure and the second lead structure is a gate lead structure.

6. The method of claim 1 wherein the flexible insulator covers a conductive region between the first electrical contact region and the second electrical contact region.

7. The method of claim 1 wherein the package is a leadless package.

8. The method of claim 1 further comprising applying a first conductive adhesive to the die contact region and applying a second conductive adhesive to the lead structure.

9. The method of claim 1 further comprising a molding a molding material around at least a portion of the semiconductor die and the leadframe structure.

10. The method of claim 1 wherein the leadframe structure further comprises a dummy lead structure.

11. The method of claim 1 wherein leadframe structure comprises a base material.

12. The method of claim 11 wherein the base material comprises copper.

13. The method of claim 11 wherein the leadframe structure comprises another material that is plated on the base material.

14. The method of claim 11 wherein the semiconductor die comprises a gate structure.

15. The method of claim 14 wherein the gate structure comprises a trenched gate structure.

16. The method of claim 15 wherein the semiconductor die comprises a power MOSFET comprising the trenched gate structure.

17. The method of claim 16 wherein the package is a leadless package.

18. The method of claim 9 wherein the flexible insulator comprises a material that is different from the molding material.

19. The method of claim 1 wherein the flexible insulator comprises polyimide or polyamide.

20. The method of claim 1 wherein the flexible insulator comprises a dielectric layer, and wherein the flex clip connector further comprises a metal layer disposed on the dielectric layer.

* * * * *

UNITED STATES PATENT AND TRADEMARK OFFICE
CERTIFICATE OF CORRECTION

| | | |
|---|---|---|
| PATENT NO. | : 7,824,966 B2 | Page 1 of 1 |
| APPLICATION NO. | : 12/544159 | |
| DATED | : November 2, 2010 | |
| INVENTOR(S) | : Quinones et al. | |

It is certified that error appears in the above-identified patent and that said Letters Patent is hereby corrected as shown below:

On the Title Page, item (54), please correct the Title of the Invention as follows:

(54) Change "FLEX CHIP CONNECTOR FOR SEMICONDUCTOR DEVICE"
     To  --FLEX CLIP CONNECTOR FOR SEMICONDUCTOR DEVICE--.

In the Claims, please make the following corrections:

Col. 7, Claim 9 lines 22-23, change "a molding a molding" to --a molding--.

Signed and Sealed this
Twenty-fifth Day of January, 2011

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,824,966 B2 | Page 1 of 1 |
| APPLICATION NO. | : 12/544159 | |
| DATED | : November 2, 2010 | |
| INVENTOR(S) | : Quinones et al. | |

It is certified that error appears in the above-identified patent and that said Letters Patent is hereby corrected as shown below:

On the Title Page, item (54) and at column 1, lines 1 and 2 please correct the Title of the Invention as follows:

Change "FLEX CHIP CONNECTOR FOR SEMICONDUCTOR DEVICE"
      To --FLEX CLIP CONNECTOR FOR SEMICONDUCTOR DEVICE--.

In the Claims, please make the following corrections:

Col. 7, Claim 9 lines 22-23, change "a molding a molding" to --a molding--.

This certificate supersedes the Certificate of Correction issued January 25, 2011.

Signed and Sealed this
Fifteenth Day of February, 2011

David J. Kappos
*Director of the United States Patent and Trademark Office*